United States Patent [19]

Kok

[11] Patent Number: 4,535,841
[45] Date of Patent: Aug. 20, 1985

[54] HIGH POWER CHIP COOLING DEVICE AND METHOD OF MANUFACTURING SAME

[75] Inventor: Paul Kok, Wappingers Falls, N.Y.

[73] Assignee: International Business Machines Corporation, Armonk, N.Y.

[21] Appl. No.: 544,907

[22] Filed: Oct. 24, 1983

[51] Int. Cl.³ .............................................. H01L 23/36
[52] U.S. Cl. .................... 165/185; 228/173.6; 228/183; 29/423; 156/155; 165/80 A; 165/81
[58] Field of Search .............. 228/175, 173 C, 183, 228/191; 156/155; 29/423; 165/185, 81

[56] References Cited

U.S. PATENT DOCUMENTS

| | | | |
|---|---|---|---|
| 2,491,258 | 12/1980 | Fuhrhop et al. | 156/155 X |
| 2,965,819 | 12/1980 | Rosenbaum | 165/185 |
| 3,095,037 | 6/1963 | Bohm | 165/185 |
| 3,180,404 | 4/1965 | Nelson et al. | 165/185 |
| 3,239,003 | 3/1966 | Boudette et al. | 165/185 |
| 3,789,494 | 2/1974 | Bostrom et al. | 29/423 |
| 4,026,455 | 5/1977 | Huebner et al. | 228/183 X |
| 4,270,604 | 6/1981 | Nakamura | 165/185 |
| 4,286,365 | 9/1981 | Creighton | 165/170 X |

FOREIGN PATENT DOCUMENTS 1226067 10/1966 Fed. Rep. of Germany ........ 29/423

Primary Examiner—Kenneth J. Ramsey
Attorney, Agent, or Firm—Sughrue, Mion, Zinn, Macpeak & Seas

[57] ABSTRACT

A leaf-type cooling device for coupling a semi-conductor chip package to a heat sink is formed by accordion pleated folding of two copper strips coated on their non-mating sides with solder and their mating sides with polysulfone and then using heat to solder the non-mating surfaces of strip folds together and the ridges defined by the folds to respective opposed solderable supports. The polysulfone adhesive is thereafter removed by solvation to form interleaved fins between the supports. Springs function to bias the supports away from each other.

8 Claims, 5 Drawing Figures

HIGH POWER CHIP COOLING DEVICE AND METHOD OF MANUFACTURING SAME

FIELD OF THE INVENTION

This invention relates to a flexible, extensible cooling devices for mounting to a semiconductor package to conduct heat from the package to a cold plate, and more particularly, to a simplified method for manufacture of the cooling device which provides a highly effective heat transfer path from the semiconductor package to the cold plate.

BACKGROUND OF THE INVENTION

The relatively high current carrying capacity of high-power semiconductor chips necessitates the conduction of the heat produced therein to an adjacent cold plate. The connection between the cold plate and the chip requires high thermal conductivity, an accommodation for small deviations from nominal distance and parallelism between the opposed surfaces of the chip and cold plate, respectively, and the connection must be inexpensive to manufacture and use. These needs have led to the development of flexible, extensible thermal conduction elements integrated to a semiconductor package to conduct heat from the chips to a cold plate, cover or cap which feature a plurality of thin flexible, interleaved leaf elements capable of spanning the gap between the chip or other semiconductor device and the cold plate while accommodating for gap variability and chip from parallelism between opposed surfaces of the device and cold plate. Such cooling devices integrated to a high power chip package are the subject matter of copending U.S. application Ser. No. 289,025 filed Aug. 3, 1981 by Louis Drucker Lipschutz, and assigned to the common assignee.

In that application, a cooling device functions as a thermal bridge element in a semiconductor package to conduct heat from the back side of solder bonded semiconductor devices or chips to a cold plate located in close proximity to the device. A first set of flat, thin, flexible leaf elements are held as a first unit with first spacer means spacing the first set of individual leaf elements such that a portion of the leaf elements project beyond the spacer means. A second set of flat, thin, flexible leaf elements, which have portions disposed in slidable overlapping relation to the first set of leaf elements, are maintained in position by second spacer means. Spring means function to bias the first and second units in outwardly extended relation. As such, the elements consist generally of a plurality of interleafed thin plates arranged so that the element is expandable and these leaf elements are also capable of adjusting while in intimate contact, even though the base surface may be tilted relative to the cap surface. Such elements exhibit extremely low thermal resistance.

While each cooling device unit functions effectively to transmit heat to the cold sink, the individual cooling devices are formed of a relatively large number of parts, may exhibit some difficulty in manufacture, and as such tend to be expensive.

It is, therefore, a primary object of the present invention to provide a highly economic and simplified, flexible, extensible, high thermal conduction, high power chip cooling device which is capable of meeting the high thermal load dissipation requirements of the rapidly advancing technology of high power integrated circuit chips.

SUMMARY OF THE INVENTION

This invention is directed to a method of making a leaf-type cooling device for semiconductor chip packages and to the device manufactured in accordance with the method. The method basically comprises the steps of:

removably laminating two strips of a heat transfer metal together back-to-back with a solvent soluble adhesive to form a composite strip;

coating the non-mating exposed planar surfaces of said composite strip with a solder;

folding the composite strip in accordion pleated fashion with compacted folds in abutment with one another and forming ridges at the fold lines thereof;

positioning the folded composite strip between solderable supports having the opposed faces of the supports in contact with respective opposed ridges of the folded composite strip;

heating the composite strip to solder the ridges to respective ones of the supports and to solder adjacent folds of the same strip to each other; and removing the adhesive by solvation in a solvent to form interleaved fins between the supports.

The step of the coating the non-mating planar surfaces of the composite strip with a solder may comprise precoating the non-mating planar surface of both strips with a solder layer prior to lamination of the strips together by way of the adhesive to form the composite strip. The method may additionally comprise the step of mechanically interlocking the solderable supports such that the supports have limited movement towards and away from each other, whereby subsequent to the step of removing adhesive by solvation, the interleaved fins may slide on each other, limited to the extent of interlocking between the solderable supports. Further, the method may comprise the step of precoating the solderable supports on their opposed faces with solder to facilitate soldering of the folded composite strip at the ridges to the opposed faces of the supports upon heating of the assembled composite strip with the supports positioned on opposite sides thereof.

DESCRIPTION OF THE PREFERRED EMBODIMENT

Figure 1:
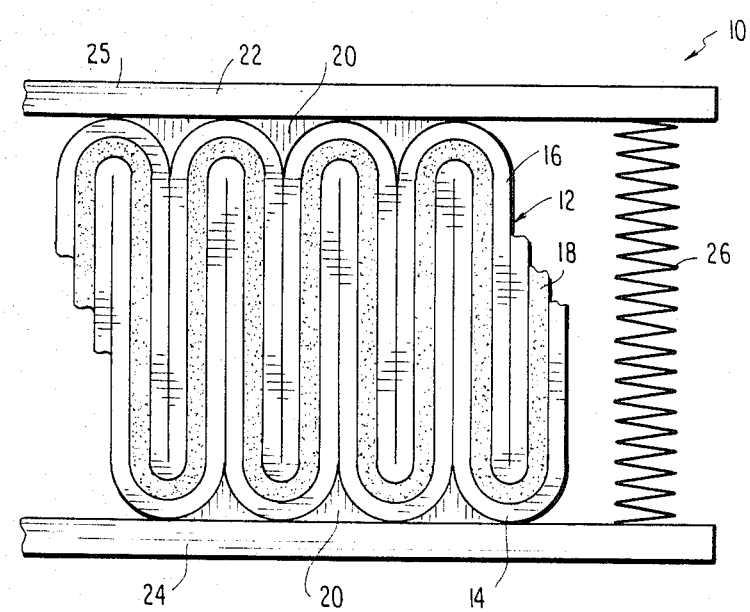
FIG. 1 is a schematic, vertical cross-sectional view of a high power chip cooling device forming one embodiment of the present invention, after soldering and prior to dissolving the polysulfone adhesive between the accordion pleat folded conductive metal strip assembly components, illustrating an important step in the method of production of the cooling device.

Referring first to the schematic representation of FIG. 1, one aspect of the present invention is directed to a method of forming a cooling device which will function to transmit in a low thermal impedance manner, heat from a high power semiconductor chip to a heat sink capable of functioning to dissipate that heat. Such a cooling device 10 is illustrated schematically and its method of manufacture involves the step of removably laminating two strips 14 and 16 of heat transfer metal such as copper, together in a back-to-back relationship by applying a solvent soluble adhesive 18, such as polysulfone, to mating faces thereof to form a composite strip indicated generally at 12. The opposite, exposed, non-mating planar surfaces of the strips 14, 16, are coated with solder as at 20. Incidentally, the solder may be applied to one surface of the individual strips 14, 16 prior to laminating the two strips 14 and 16 together with the solvent soluble adhesive, polysulfone 18.

Next, the composite strip 12 is folded into an accordion pleated or serpentine configuration with compacted folds in abutment with one another. Subsequent thereto, the folded composite is positioned between two solderable supports such as an upper housing half 22 and a lower housing half 24 with the supports having their opposed faces in contact with respective opposed ridges defined by the fold lines of the folded composite strip 12. By heating the assembly so formed, the ridges are soldered to respective ones of the supports 22, 24 and the adjacent folds of respective heat conductive strips 14, 16 are soldered to each other.

The final step in the simplified process is to remove the polysulfone adhesive, by solvation in the solvent, to form interleaved fins between the supports 22, 24, defined by respective strips 14, 16. Preferably, biasing means such as a spring or springs 26 are interposed between the supports 22, 24 tending to bias the supports away from each other. The removal of the polysulfone adhesive 18 permits the fins defined by the folded strips 14, 16 to rub lightly on each other and form a highly effective heat transfer path between the supports 22 and 24. The springs 26 insure support contact with the surface of the high power semiconductor chip on that side of one support remote from the composite strip 12 and a cold plate (in which a coolant may be circulated) in direct intimate contact with the outside surface of the other support. To dissolve away the polysulfone, a solvent such as EMP is applied to the assembly shown schematically in FIG. 1 by solvent spray application, dipping of the assembly into a body of liquid solvent or the like.

Figure 2:
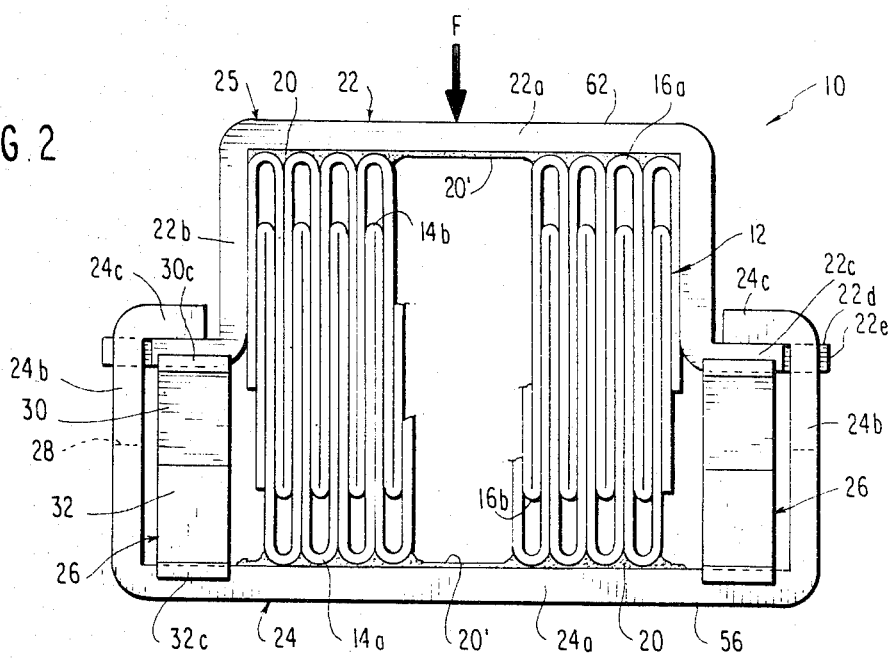
FIG. 2 is a front elevational view of a high power chip coating device forming a preferred embodiment of the present invention.
Figure 3:
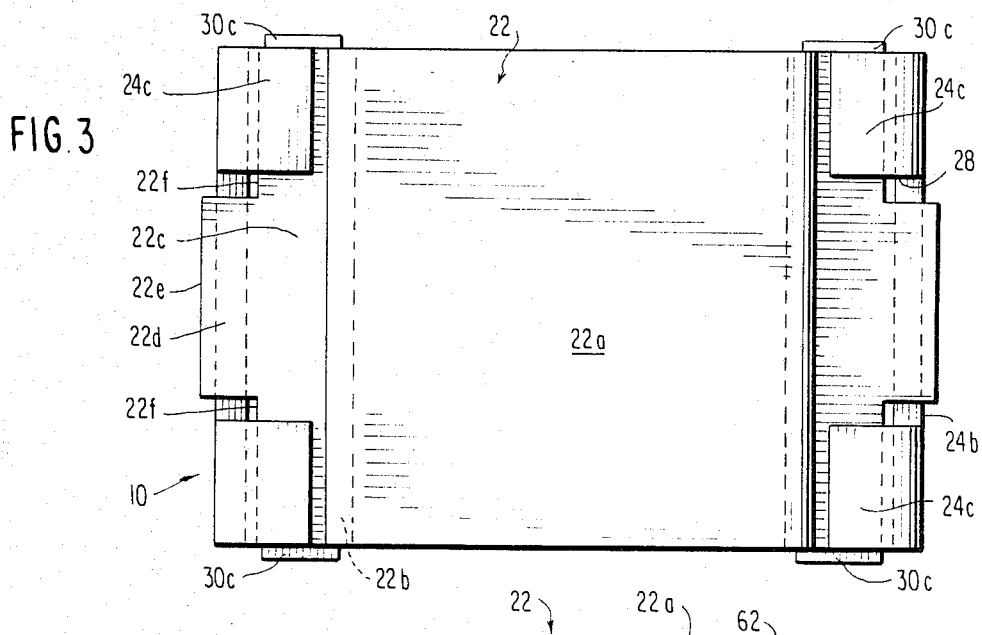
FIG. 3 is an end view of the device of FIG. 1.
Figure 4:
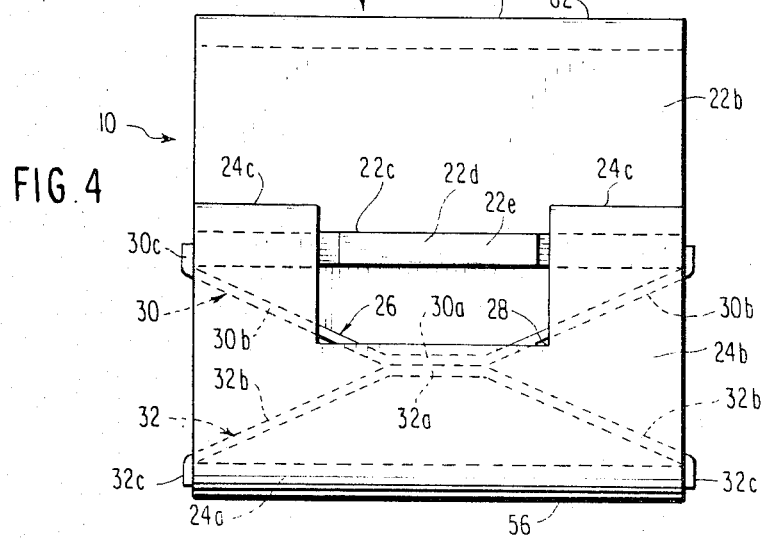
FIG. 4 is a top plan view of the device of FIG. 1.

Referring next to FIGS. 2, 3 and 4, a preferred embodiment of the present invention which follows the schematic rendition of FIG. 1 employs as principal components in identical fashion to the schematic representation with ike numerals identifying like components; a folded, heat conductive composite strip 12; a two part housing 25 consisting of base or lower support 24, and cap or upper support 22, and a pair of compression springs 26 located on opposite sides of the composite strip 12, interposed between the base 24 and cap 22 and biasing these components of the housing 25 away from each other.

The embodiment of FIGS. 2-4 inclusive shows the high power chip cooling device 10 after completion of the manufacture process described in some detail above with respect to the schematic representation of FIG. 1 and after manufacture in full accordance with that process. The housing upper support or cap 22 as well as the lower support or base 24 are both formed of a heat conductive metal plate or strip, such as copper, of elongated, rectangular plan configuration which are stamped and bent, or otherwise formed, to the configurations shown. The housing cap 22 is bent intermediate of its ends to form a central section 22a, from which depends at right angles thereto, sidewalls sections 22b whose ends are then bent outwardly to form flanges at 22c.

Additionally, the flanged ends 22c, from their outer edge 22e inwardly to a degree in excess of the thickness of the base 24, are recessed as at 22f at both sides thereof to form a projecting center tab 22d for each of the flanges.

Underlying the cap 22, and loosely coupled thereto is the base or lower housing support 24. It is also formed of a strip of copper or other heat conductive metal, and is bent upwardly at both ends defining a flat horizontal center section 24a and vertically upright sidewalls 24b which sidewalls terminate in reversely bent ends 24c. Additionally, both sidewalls 24b are cut out to form a central, rectangular slot 28 which defines a window or opening through which project tabs 22d of the cap 22. Under this arrangement, with the reversely bent ends of the base 24 overlying flanges 22c of the housing cap 22, the cap 22 is free to move vertically towards and away from the base, limited, at the top, by the reversely bent ends 24c of the base and at the bottom by the depth of slots 28 within the sidewalls 24b of base 24. Each spring 26 is composed of back-to-back reversely bent leaf spring members indicated generally at 30 and 32, which include respectively, center sections 30a and 32a which are spot welded or riveted together, and at both sides thereof, diverging legs 30b and 32b respectively. Legs 30b, 32b, terminate in lips as at 30c, 32c, respectively, which lips are directed perpendicular to the center sections 30a, 32a of respective leaf spring members 30 and 32.

In their relaxed state, each of the springs 26 expand to a greater vertical height than that shown in FIGS. 2, 3 and 4, such that they exert forces tending to maximize the distance between the center sections 22a and 24a of housing cap and base components respectively.

In the exact manner described in the schematic representation of FIG. 1, the accordion pleat folded composite strip 12 comprises a folded pair of long copper strips as at 14, 16 in which, on their non-mating faces of the strips, are completely solder coated, while their mating faces are joined by a soluble adhesive such as polysulfone. This prevents solder working and controls spacing for the interleaved folded pair of copper strips. In folding the composite strip 12, the fold lines are spaced in the running direction of the copper strips 14 and 16 for the individual folds, such that the folded, composite strip 12 initially is of a height which is less than the maximum distance between the cap and base of center sections 22a and 24a, respectively. During manufacture, and upon placement of the prefolded, presolder coated and nonwetting coated folded strips 14 and 16, the housing cap 25 falls by gravity onto the base 24 unless compressed together under applied pressure as illustrated schematically by the arrow F. This permits the ridges as at 16a, 14a on the non-mating faces of strips 14 and 16 to contact the inside surfaces of housing center section 22a and base center section 24a, respectively. Preferably springs 26 are applied after soldering.

It should be appreciated that the longitudinal length of the folded composite strip 12, is such that there is some lateral compression on the composite strip 12. In addition, and preferably, a layer of solder 20' is preapplied to the inside surfaces of housing cap center section 22a and base center section 24a. The assembly thus formed with or without a force F applied thereto, is placed in an oven (not shown) and heated. The solder 20 between the folds of the strips 14 and 16 and the applied solder 20' to the inside surface of the cap and base, melt together and upon cooling, the ridges 14a, 16a of the accordion pleated composite strip 12 are rigidly bonded to the cap and base center sections 22a, 24a, respectively, while the non-mating surfaces of respective accordion pleat folded strips 14 and 16 are likewise rigidly bonded to each other, defining heat conductive fins.

Subsequent to that step and cooling of the solder at 22 and 20', springs 26 are interposed between the base center section 24a near its ends, and the cap flanges 22c. With the springs 26 applying forces tending to separate the interfolded strips, strip separation occurs as a result of the solvent type adhesive being dissolved by a suitable solvent. The unit may be dipped into a bath of solvent. If the adhesive constitutes polysulfone, it may be readily dissolved with EMP.

With the cap 22 moving away from the base 24 to the extent defined by the reversely turned ends 24c of base 24 and flanges 22c of the housing cap 22, the inside ridges 14b and 16b of composite strip 12 defining fins for strips 14 and 16 move outwardly, away from their soldered outboard ridges 16a and 14a. However, due to the compacting of the accordion pleated strips 14 and 16, and the fact that the non-mating surfaces of these strips (of one strip 14 with respect to the other 16) become soldered together and form side-to-side contacting leaves or fins for the cooling device 10, they slide in good surface contact with each other, moving relative to each other to the extent of allowed expansion of springs 26. The major portions of the fins overlap each other.

From the above description, it is apparent that there are mechanical features which highlight the cooling device and enhance its cooling operation, particularly for low resistance cooling of high-power chips. The cap and base components 22, 24 of housing 25 mechanically interlock, to maintain integrity. The spring loading provided by springs 26 maintains thermal contact between the outside surfaces of the cap and base as applied to opposing chip and cold plate members. The low melting alloy solder facilitates the external contact of composite strip 12 to both the cap and base at center sections 22a and 24a, respectively. The rounded fin ends created by accordion pleat folded ridges, upon separation of the mating surfaces by dissolving of the polysulfone, have no burrs and slide easily on each other while maintaining lateral contact between the interleaved fins. As a result, it is almost impossible to bind the fins irrespective of any tilting which may occur between the cap and base due to non-alignment of the chip and thermal heat sink components. The solder aids in the conductivity of the double leaved fins defined by the folds for respective strips 14, 16, and between the folded fins and the base and cap center sections. The construction permits a low profile for the cooling device with a relatively short heat path between a chip and its heat sink. Each cooling device utilizes but eight pieces of metal initially; two copper strips, two copper housing shells and four spring members (welded in pairs) to form the right and left side springs 26 in the embodiment of FIGS. 2-4 inclusive. The components for the housing 25, i.e. cap and base 22, 24, are subject to standard stamping and forming operations and are thus low cost and simple to manufacture.

The construction permits considerable freedom to tilt the cap with respect to the base without adversely affecting its capability of transferring heat away from the chip.

Figure 5:
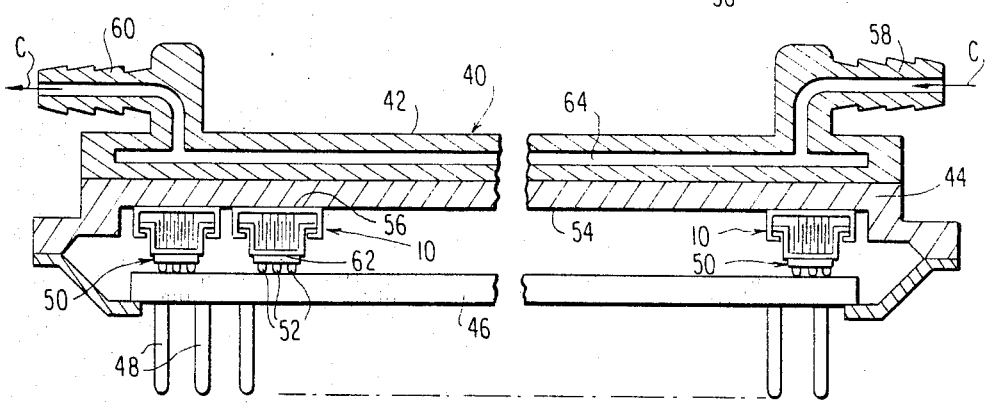
FIG. 5 is vertical sectional view of a semiconductor package utilizing a plurality of the cooling devices of FIGS. 1 through 4 inclusive.

Reference to FIG. 5 shows a typical semiconductor package, indicated generally 40, which functions to conduct heat from the back side of solder bonded semiconductor chips 50 to a cold plate 44 located in close proximity thereto, using a series of cooling devices 10 in accordance with the present invention. A plurality of semiconductor chips as at 50 are positioned such that their contact balls 52 rest on a power and signal supply printed circuit member 46 with power and control signals supplied thereto via pins 48. A plurality of high power chip cooling devices 10 are interposed between the cold plate 44 and the back side of respective chips 50 such that the outside face 56 of base 24 of the cooling device housing 25 makes full surface contact with the bottom face 54 of cold plate 44. As may be appreciated, the cooling devices 10 shown in FIGS. 2, 3 and 4 are inverted with the outside surface or face 62 of the housing cap center section 22a making full surface contact with the back side of the semiconductor chip 50.

Cold plate 44 functions to mount the planar printed circuit member 46. The thickness of the printed circuit member 46 is such that the gap between the printed circuit member 46 and cold plate 44 bottom surface 54 is less than the uncompressed distance between the outside surface 56 of base center section 24a and outside surface 62 of the cap center section 22a, thereby requiring compression of the springs 26 when cooling device 10 is interposed between cold plate 44 and a chip 50. This is permitted because the fins defined by the interfolded strips 14 and 16 slide on each other while maintaining excellent contact therebetween to provide the low thermal impedance heat transfer path between the chips 50 and the cold plate 44. Integrally mounted to cold plate 44 is a heat sink cooling manifold 42 sized to the cold plate 44 and in overlying face contact with the outer surface of that member. A chamber 64 bearing coolant, indicated by arrows C, removes the heat generated within chip 50 and transferred to the cold plate 44. The coolant is circulated under pressure through the chamber 64, entering via inlet nipple 58 and leaving by outlet nipple 60. The nipples are connected to a source of circulating coolant C by way of hoses (not shown) mounted thereto. The coolant is circulated at rates depending upon the thermal load imposed thereon.

While the invention has been particularly shown and described with reference to a preferred embodiment thereof, it will be understood by those skilled in the art that various changes in form and details may be made therein without departing from the spirit and scope of the invention.

I claim:

1. A method of making a leaf-type cooling device for semiconductor chip packages, said method comprising the steps of:
    removably laminating two strips of a heat transfer metal together back-to-back with a solvent soluble adhesive to form a composite strip;
    coating the non-mating exposed planar surfaces of said composite strip with a solder;
    folding said composite strip in accordion pleated fashion with compacted folds in abutment with one another and forming ridges at the fold lines thereof;
    positioning said folded composite strip between solderable supports having the opposed faces of said supports in contact with respective opposed ridges of said folded composite strip;

heating said composite strip to solder said ridges to respective ones of said supports and to solder adjacent folds of the same strip to each other; and removing said adhesive by solvation in a solvent to form interleaved fins between said supports.

2. The method as claimed in claim 1, wherein said step of coating the non-mating planar surfaces of said composite strip with a solder comprises precoating said non-mating planar surfaces of both strips with a solder layer prior to lamination of said strips together to form said composite strip.

3. The method as claimed in claim 1, further comprising the step of mechanically interlocking said solderable supports such that said supports have limited movement towards and away from each other such that subsequent to the step of removing the adhesive by solvation, the interleaved fins may slide on each other limited to the extent of interlocking between said solderable supports.

4. The method as claimed in claim 3, further comprising the step of subjecting said solderable supports to a biasing force during the step of removing the adhesive by solvation such that the supports are forced to more away from each other upon destruction of the adhesive bond between the strips forming said composite strip.

5. The method as claimed in claim 1, further comprising the step of precoating said solderable supports on their opposed faces with solder to facilitate soldering of said folded composite strip at said ridges to said opposed faces of said supports upon heating of the assembled composite strip and supports on opposite sides thereof.

6. A leaf-type cooling device for semiconductor chip packages manufactured in accordance with the method comprising the steps of:

removably laminating two strips of a heat transfer metal together back-to-back with a solvent soluble adhesive to form a composite strip;

coating the non-mating exposed planar surfaces of said composite strip with a solder;

folding said composite strip in accordion pleated fashion with compacted folds in abutment with one another and forming ridges at the fold lines thereof;

positioning said folded composite strip between solderable supports having opposed faces of said supports in contact with respective opposed ridges of said folded composite;

heating said composite strip to solder said ridges to respective ones of said supports and to solder adjacent folds of the same strip to each other; and removing said adhesive by solvation in a solvent to form interleaved fins between said supports;

thereby producing a low cost, low impedance heat transport device of a minimal number of components which may be subject to standard stamping and forming operations.

7. The cooling device as claimed in claim 6, wherein the step of coating the non-mating planar surfaces of said composite strip assembly with a solder comprises precoating said non-mating planar surfaces of both strips with a solder layer prior to lamination of said strips together to form said composite strip.

8. The cooling device as claimed in claim 7, further comprising the step of mechanically interlocking said solderable supports to the extent that said supports have limited movement towards and away from each other and applying spring biasing forces tending to move said solderable supports away from each other prior to the step of removing the adhesive by solvation; whereby, at the time the adhesive is dissolved and the bond between the strips is terminated, the interleaved fins slide on each other limited to the extent of interlocking between said solderable supports.

* * * * *